(12) United States Patent
Sil et al.

(10) Patent No.: US 12,272,545 B2
(45) Date of Patent: Apr. 8, 2025

(54) EMBEDDED METAL CONTAMINATION REMOVAL FROM BEOL WAFERS

(71) Applicant: International Business Machines Corporation, Armonk, NY (US)

(72) Inventors: Devika Sil, Rensselaer, NY (US); Ashim Dutta, Menands, NY (US); Yann Mignot, Slingerlands, NY (US); John Christopher Arnold, North Chatham, NY (US); Daniel Charles Edelstein, White Plains, NY (US); Kedari Matam, Albany, NY (US); Cornelius Brown Peethala, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/824,559

(22) Filed: Mar. 19, 2020

(65) Prior Publication Data
US 2021/0296118 A1    Sep. 23, 2021

(51) Int. Cl.
  *H01L 21/3213*    (2006.01)
  *H01L 21/02*      (2006.01)
  *H01L 21/3065*    (2006.01)

(52) U.S. Cl.
  CPC .... *H01L 21/02087* (2013.01); *H01L 21/3065* (2013.01)

(58) Field of Classification Search
  CPC .............. H01L 21/30604; H01L 21/32134
  See application file for complete search history.

(56) References Cited

U.S. PATENT DOCUMENTS

| | | | |
|---|---|---|---|
| 5,759,921 A * | 6/1998 | Rostoker | H01L 21/3065 438/719 |
| 6,309,981 B1 | 10/2001 | Mayer et al. | |
| 6,333,275 B1 | 12/2001 | Mayer et al. | |
| 6,586,342 B1 | 7/2003 | Mayer et al. | |
| 6,911,386 B1 * | 6/2005 | Lee | H01L 23/5258 257/E23.15 |
| 6,936,546 B2 | 8/2005 | Robbins | |
| 7,256,148 B2 | 8/2007 | Kastenmeier et al. | |
| 7,780,867 B1 | 8/2010 | Mayer et al. | |
| 8,308,896 B2 | 11/2012 | Kim et al. | |
| 8,414,790 B2 | 4/2013 | Bailey, III et al. | |
| 9,178,136 B2 | 11/2015 | Wu et al. | |
| 9,564,308 B2 | 2/2017 | Sexton et al. | |
| 9,705,077 B2 | 7/2017 | Annunziata et al. | |

(Continued)

*Primary Examiner* — Thomas T Pham
(74) *Attorney, Agent, or Firm* — Kristofer Haggerty (57) ABSTRACT

A novel bevel etch sequence for embedded metal contamination removal from BEOL wafers is provided. In one aspect, a method of processing a wafer includes: performing a bevel dry etch to break up layers of contaminants with embedded metals which, post back-end-of line metallization, are deposited on a bevel of the wafer, which forms a damaged layer on surfaces of the wafer, and then performing a sequence of wet etches, following the bevel dry etch, to render the bevel of the wafer substantially free of contaminants, wherein the sequence of wet etches includes etching the damaged layer to undercut and lift-off any remaining contaminants. A wafer, processed in this manner, having a bevel that is substantially free of contaminants is also provided.

16 Claims, 4 Drawing Sheets

(56) References Cited

U.S. PATENT DOCUMENTS

| | | | | |
|---|---|---|---|---|
| 2001/0038115 A1* | 11/2001 | Amanuma | .............. | H01L 28/40 |
| | | | | 257/E21.582 |
| 2004/0087125 A1* | 5/2004 | Monoe | .............. | H01L 29/78621 |
| | | | | 257/E21.582 |
| 2004/0159335 A1* | 8/2004 | Montierth | ......... | H01L 21/31133 |
| | | | | 134/10 |
| 2006/0205623 A1* | 9/2006 | Oowada | .................. | G03F 7/426 |
| | | | | 510/175 |
| 2006/0258177 A1* | 11/2006 | Kastenmeier | ....... | H01L 21/3065 |
| | | | | 438/798 |
| 2007/0148913 A1* | 6/2007 | Kim | .................. | H01L 21/31116 |
| | | | | 438/458 |
| 2009/0169767 A1* | 7/2009 | Huang | ................ | H01L 21/0206 |
| | | | | 427/535 |
| 2013/0267099 A1* | 10/2013 | Yu | ..................... | H01L 21/67109 |
| | | | | 438/748 |
| 2016/0020299 A1* | 1/2016 | Gregory | ............ | H01L 29/66477 |
| | | | | 438/299 |
| 2017/0278752 A1* | 9/2017 | Ryckaert | ........... | H01L 21/76802 |
| 2017/0301566 A1 | 10/2017 | Fang et al. | | |

* cited by examiner

EMBEDDED METAL CONTAMINATION REMOVAL FROM BEOL WAFERS

FIELD OF THE INVENTION

The present invention relates to back-end-of-line (BEOL) wafer processing, and more particularly, to a novel bevel etch sequence for embedded metal contamination removal from the bevel and backside of BEOL wafers.

BACKGROUND OF THE INVENTION

Back-end-of-line (BEOL) integration typically involves the use of a variety of different materials such as the dielectric and metal hardmask and interconnect structures. During patterning and metallization processes, the back side and beveled edge of a wafer are often left with full or residual film of these materials that pose a risk to the contamination of downstream tools.

The removal of these contaminants from the wafer can present some notable challenges. For instance, the thickness of bevel edge metal films is typically non-uniform, i.e., ranging from about 10 nanometers (nm) to about 200 nm, and often contains embedded contamination of different metals. As a result, contamination levels exceeding 100× $10^{10}$ atoms per square centimeter (at/cm$^2$) are often encountered, while most manufacturing specifications require a contamination level of at most 5×10$^{10}$ at/cm$^2$.

Conventional approaches employ a dry etch and a wet etch for general contaminant removal. However, no approach has been presented to date that is wholly effective for the removal of multilayered and/or embedded metal contamination from the back side and bevel of a BEOL wafer.

Accordingly, improved metal contamination removal techniques for BEOL wafers would be desirable.

SUMMARY OF THE INVENTION

The present invention provides a novel bevel etch sequence for embedded metal contamination removal from back-end-of-line (BEOL) wafers. In one aspect of the invention, a method of processing a wafer is provided. The method includes: performing a bevel dry etch to break up layers of contaminants with embedded metals which, post back-end-of line metallization, are deposited on a bevel of the wafer, wherein the bevel dry etch forms a damaged layer on surfaces of the wafer; and performing a sequence of wet etches, following the bevel dry etch, to render the bevel of the wafer substantially free of contaminants, wherein the sequence of wet etches comprises etching the damaged layer to undercut and lift-off any remaining contaminants.

In another aspect of the invention, a processed wafer is provided having a bevel that, post back-end-of line metallization, is substantially free of contaminants, wherein the bevel includes a portion of the wafer that is less than or equal to about 3 millimeters in from an edge of the wafer. For instance, the bevel has a contamination level of less than or equal to about 5×10$^{10}$ at/cm$^2$.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for embedded metal contamination removal from back-end-of-line (BEOL) wafers using a novel combination of dry etch and wet etch processes performed in a certain sequence designed to break up first and then remove films of the metal contaminants. Advantageously, the result is a wafer bevel and backside with a surface substantially free of metal contamination.

Figure 1:
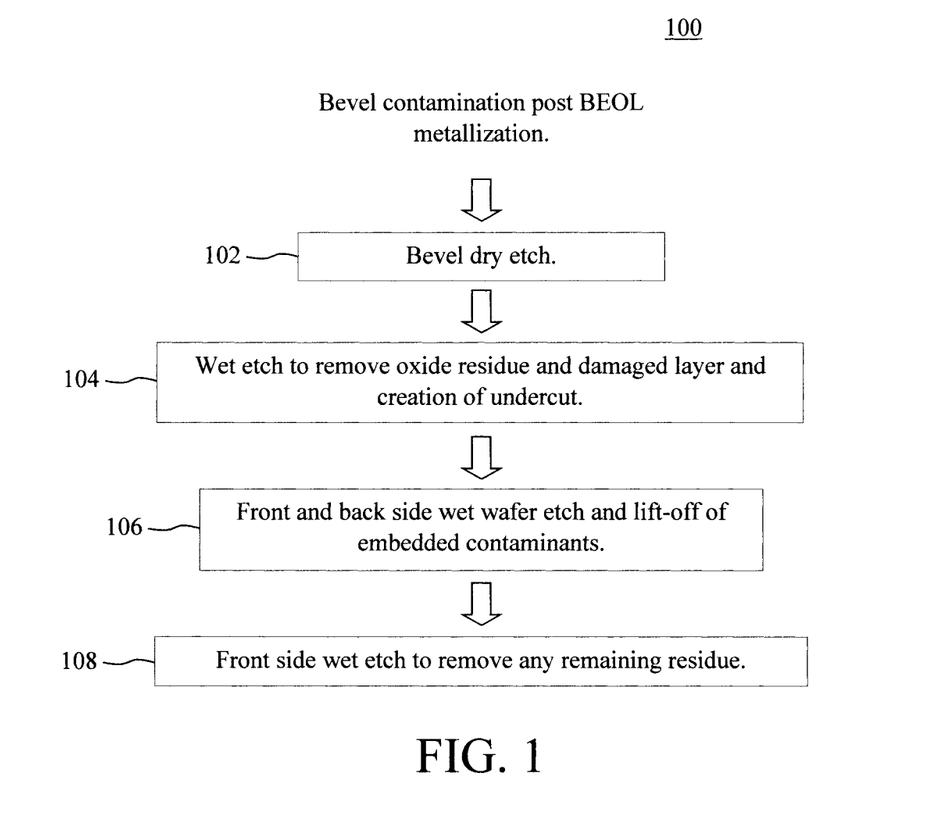
FIG. 1 is a diagram illustrating an exemplary methodology for processing a wafer according to an embodiment of the present invention.

An overview of the present process is now provided by way of reference to methodology 100 of FIG. 1. As shown in FIG. 1, the process begins with a semiconductor wafer post BEOL metallization which leads to contamination of the wafer bevel. By way of example only, the term 'bevel' as used herein refers to portions of the semiconductor wafer less than or equal to about 3 millimeters (mm) in from the edge of the semiconductor wafer. By way of non-limiting example only, according to an exemplary embodiment, the semiconductor wafer is a silicon (Si)-containing wafer such as a bulk Si and/or bulk silicon germanium (SiGe) wafer. Alternatively, the semiconductor wafer can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, SiGe, etc.

The term 'metallization' as used herein refers generally to any one of several different processes performed to form metal-containing elements of a semiconductor circuit design, such as interconnects (e.g., metal lines, conductive vias, etc.), wires, etc. As generally known in the art, metallization processes oftentimes involve depositing a dielectric material(s), patterning a feature(s) (such as trenches and/or vias) in the dielectric material(s), and then filling the features with a metal(s). Some common processes performed in this manner are the so-called damascene and dual-damascene processes.

These metallization processes, however, result in the deposition of the metals and dielectric materials along the surface of the semiconductor wafer, including at the edge of the wafer. Some commonly encountered metals include, but are not limited to, aluminum (Al), copper (Cu), iron (Fe), ruthenium (Ru), tantalum (Ta), titanium (Ti), chromium (Cr), and/or cobalt (Co). Some commonly encountered dielectric materials include, but are not limited to, oxide dielectric materials such as silicon oxide (SiOx) and/or nitride dielectric materials such as silicon nitride (SiN). In some cases, these contaminants can form continuous layers that wrap around the edge of the semiconductor wafer, i.e., the films span the bevel from the front side of the semiconductor wafer to the back side of the bevel edge of the semiconductor wafer. As highlighted above, these contaminant films are oftentimes multilayered, non-uniform in thickness, and contain a combination of different embedded metals. As such, the same cleaning process cannot be used to effectively remove all contaminants.

With conventional BEOL wafer cleaning processes, a bevel dry etch is often performed followed by a wet etch. However, an improved solution is needed to effectively remove these embedded metals and produce a wafer bevel with a surface that is truly free of any metal contamination. As such, following conventional BEOL wafer cleaning processes the contamination levels still far exceed the cleanliness level needed for most semiconductor device specifications. Advantageously, the techniques presented herein provide a unique sequence of dry etch and wet etch processes designed to effectively remove contaminants including embedded metals from the wafer bevel.

As shown in step 102, the first contamination removal step is a dry etch carried out at the semiconductor wafer bevel (this step is also referred to herein as a 'bevel dry etch'). As provided above, the bevel is the portion of a semiconductor wafer less than or equal to about 3 mm in from the edge of the semiconductor wafer. According to an exemplary embodiment, the bevel dry etch is performed using specific chemistries for removing dielectric materials and metallic elements. For instance, suitable etch chemistries for removing dielectric materials include, but are not limited to, fluorine (F)-containing plasmas such as tetrafluoromethane ($CF_4$)-, sulfur hexafluoride ($SF_6$)- and/or nitrogen trifluoride ($NF_3$)-containing plasmas. Suitable etch chemistries for removing metallic elements include, but are not limited to, chlorine (Cl)-containing plasmas such as dichlorine ($Cl_2$)- and/or boron trichloride ($BCL_3$)-containing plasmas. By way of example only, in one non-limiting embodiment, the bevel dry etch is performed in step 102 in multiple cycles employing alternating etch chemistries (see above) for removing specific materials/elements, i.e., layer by layer. According to an exemplary embodiment, the bevel dry etch is performed only on the wafer bevel (e.g., less than or equal to about 3 mm in from the wafer), while the rest of the wafer is protected by a plasma exclusion zone. For instance, a plasma exclusion zone ring can be employed in the bevel etcher. See, for example, U.S. Patent Application Publication Number 2017/0301566 A1 by Fang et al., entitled "Lower Plasma-Exclusion-Zone Rings for a Bevel Etcher," the contents of which are incorporated by reference as if fully set forth herein.

As will be described in detail below, the bevel dry etch performed in step 102 leaves behind raised structures such as pillars, whiskers, grass structures, micromasking, etc. on the surfaces of the wafer due to the extensive etch needed to break up the layers of contaminant, as well as the high selectivity difference between the wafer material (e.g., Si) and the metallic elements. The presence of these structures on the front/device side of the wafer can undesirably lead to particle issues that can lead to a loss in overall device yield. The dry bevel etch also leaves behind a damaged layer on the surface of the wafer that needs to be removed. Further, the exposure of the wafer to the ambient environment typically results in the formation of a native oxide on the wafer surface which needs to be removed.

Thus, following the dry bevel etch, a sequence of wet etch steps are performed, preferably in a particular order, to produce a wafer bevel surface substantially free of metal contamination. As will be described in detail below, this sequence of wet etch steps includes etching the damaged layer to undercut and lift-off any insoluble metal contaminants. As highlighted above, the goal is to produce a wafer (after the bevel dry etch and sequence of wet etch steps have been performed) with a final contamination level of less than or equal to about at most $5 \times 10^{10}$ atoms per square centimeter (at/$cm^2$). Scanners for analyzing contaminants on a wafer are commercially available, for example, from Agilent Technologies, Santa Clara, CA.

As shown in step 104, the first wet etch step in the sequence is employed to remove the surface oxide and damaged layer following the dry bevel etch. According to an exemplary embodiment, step 104 includes a first (1) wet etch performed on the back side of the wafer to remove the surface oxide and damaged layer from the back side of the wafer, followed by a second (2) wet etch performed on the front side of the wafer to remove the surface oxide and damaged layer from the front side of the wafer. Sequentially cleaning the back side of the wafer first, followed by the front side of the wafer helps reduce the effects of splash back during the cleaning process. Namely, splash back of etchants and contaminants can cause contaminants removed from the back side of the wafer to become redeposited onto the front side of the wafer. Thus, cleaning the front side of the wafer after the back side subsequently removes any of these splash back contaminants.

According to an exemplary embodiment, the etchants used for this first wet etch step 104 include, but are not limited to, hydrofluoric acid (HF) or a hydrogen peroxide ($H_2O_2$):ammonium hydroxide ($NH_4OH$) mixture. For instance, a mixture of $H_2O_2$:$NH_4OH$ is effective in removing the particles and residue that make up the damaged layer following the bevel dry etch. HF is well suited to removing surface oxide. According to an exemplary embodiment, an aqueous solution of $H_2O_2$:$NH_4OH$ is employed. The HF can be diluted in $H_2O$ (i.e., a DHF solution) at a ratio HF:$H_2O$ of from about 1:50 to about 1:100 and ranges therebetween.

As highlighted above, this first wet etch step 104 can create undercuts in the wafer. Namely, as provided above, the bevel dry etch serves to break up the (potentially continuous) layers of contaminants including the embedded metals. This permits the wet etch performed in step 104, due to its isotropic nature, to slightly undercut a surface of the wafer beneath the broken-up layers of contaminant. This undercut can advantageously help facilitate lift-off of the remaining contaminants (including any insoluble metal contaminants) from the wafer surface as described below.

Namely, as shown in step 106, the second wet etch step in the sequence is applied to the front and back sides of the wafer to etch the wafer surface and lift-off the embedded contaminants. This lift-off process is facilitated by the undercut of the contaminants that occurred during the first wet etch step 104.

According to an exemplary embodiment, the etchants used for this second wet etch step 106 include, but are not limited to, quaternary ammonium hydroxide solutions such as tetramethylammonium hydroxide (TMAH) and/or tetraethylammonium hydroxide (TEAH). For instance, in one embodiment, an aqueous solution containing from about 3 weight percent (wt %) to about 30 wt % TMAH or TEAH is employed. Etchants such as TMAH and/or TEAH are isotropic Si etchants and thus help with lift-off of the wafer surface through undercut, thereby removing any embedded metallic contamination present on the wafer. Namely, these etchants are highly selective for the wafer material. For instance, TEAH is highly selective to Si and etches Si only in the (111) crystallographic direction. Thus, the undercuts created in step 104 provide a pathway for the TMAH/TEAH to reach the wafer surface, permitting a controlled etch of the wafer surface along with any embedded defects. This etch step 106 also removes any roughness and/or Si-rich residue, needles, pitted Si and/or dry etch residues.

According to an exemplary embodiment, the treatments performed in step 106 are varied for the front side and back side of the wafer. For instance, in one exemplary embodiment, the back side of the wafer receives multiple (e.g., two) treatments with the TMAH and/or TEAH, while the front side of the wafer receives fewer (e.g., a single) treatment. The order of the treatments, front versus back side, does not matter much, however the back side treatment preferably employs an edge dispense whereby the etchant (e.g., TMAH and/or TEAH) is dispensed close to the wafer edge creating a wrap-around at the bevel with slower flow rate at the edge as well. Use of an edge dispense addresses the fact that the contaminants at the edge are thicker than on the back side of the wafer. By way of example only, a wet etchant can be dispensed on the edge of a wafer via a nozzle or other dispenser placed proximal to the wafer edge. See, for example, U.S. Pat. No. 6,586,342 issued to Mayer et al., entitled "Edge Bevel Removal of Copper from Silicon Wafers," the contents of which are incorporated by reference as if fully set forth herein.

Finally, as shown in step 108 the third wet etch step in the sequence is applied to the front side of the wafer to remove any remaining residue left inadvertently from the back side clean. Namely, as provided above, splash back of etchants and contaminants can cause contaminants removed from the back side of the wafer to become redeposited onto the front side of the wafer. Step 108 is performed to ensure that the front/device side of the wafer is substantially free of contaminants including embedded metals and to remove any surface roughness.

According to an exemplary embodiment, the etchants used for this third wet etch step 108 include, but are not limited to, HF. For instance, the HF can be diluted in $H_2O$ (i.e., a DHF solution) at a ratio $HF:H_2O$ of from about 1:50 to about 1:100 and ranges therebetween.

Figure 2:
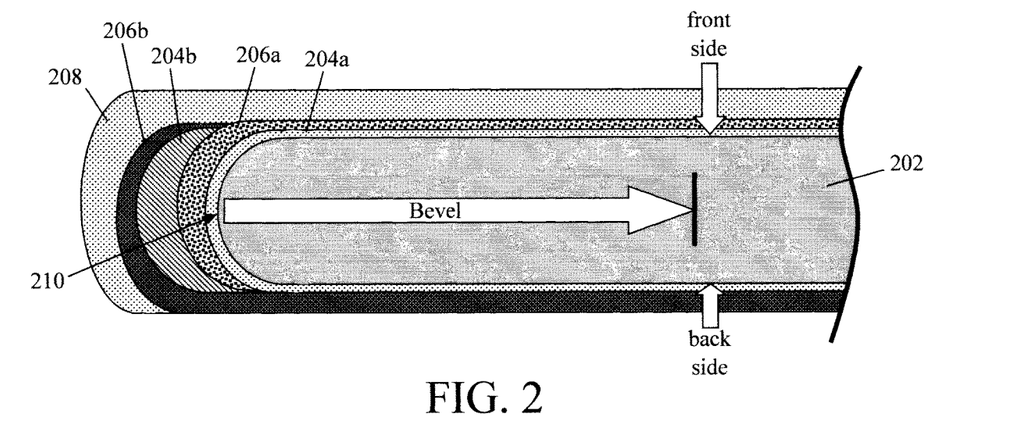
FIG. 2 is a cross-sectional diagram illustrating a wafer post back-end-of-line metallization having layers of contaminants with embedded metals deposited on a bevel of the wafer according to an embodiment of the present invention.

Given the above overview of the present techniques, an exemplary implementation of the present techniques for processing a wafer is now described by way of reference to FIGS. 2-6. As shown in FIG. 2, and as described above, a wafer 202 post BEOL metallization can contain layers of contaminants with embedded metals deposited on the bevel of the wafer 202. Namely, metallization processes performed during the fabrication of semiconductor devices on a wafer 202 typically involve the deposition of a combination of metals (e.g., Al, Cu, Fe, Ru, Ta, Ti, Cr, and/or Co) and dielectric materials (e.g., SiOx and/or SiN) onto a front side of the wafer 202. For instance, by way of example only, a metal(s) 206a,b, etc. can be deposited over a dielectric(s) 204a,b, etc. to form various elements of a semiconductor device, which are then encapsulated in additional dielectric 208. As such, by way of this process the metal(s) 206a,b, etc. are embedded in dielectrics 204a,b, etc., 208, etc.

As shown in FIG. 2, these layers of dielectrics 204a,b, etc., 208, etc. with embedded metal(s) 206a,b, etc. can form continuous layers that wrap around the bevel of the wafer 202 to a back side of the wafer 202. According to an exemplary embodiment, the bevel is the portion of wafer 202 less than or equal to about 3 mm in from an edge 210 of wafer 202. These continuous layers of dielectric 204a,b, etc., 208, etc. with embedded metal 206a,b, etc. are the contaminants that are removed from the bevel by way of the present techniques.

As provided above, one challenge associated with effectively removing these layers of contaminants from the bevel of wafer 202 is that the layers have non-uniform thicknesses. Namely, as shown in FIG. 2, the layers of dielectric 204a,b, etc., 208, etc. and metal(s) 206a,b, etc. can vary in thickness from one another. Further, the thickness of a given layer can vary along the front side, edge and back side of the wafer 202. An additional challenge associated with effectively removing these layers of contaminants from the bevel of wafer 202 is that they contain a combination of different materials and embedded metals. For instance, the composition of dielectric 204a,b, etc. and (encapsulant) dielectric 208 can vary from one another. Further, the composition of the embedded metals 206a,b, etc. used for different device components can vary, thus adding an additional level of complexity to the cleaning process.

Figure 3:
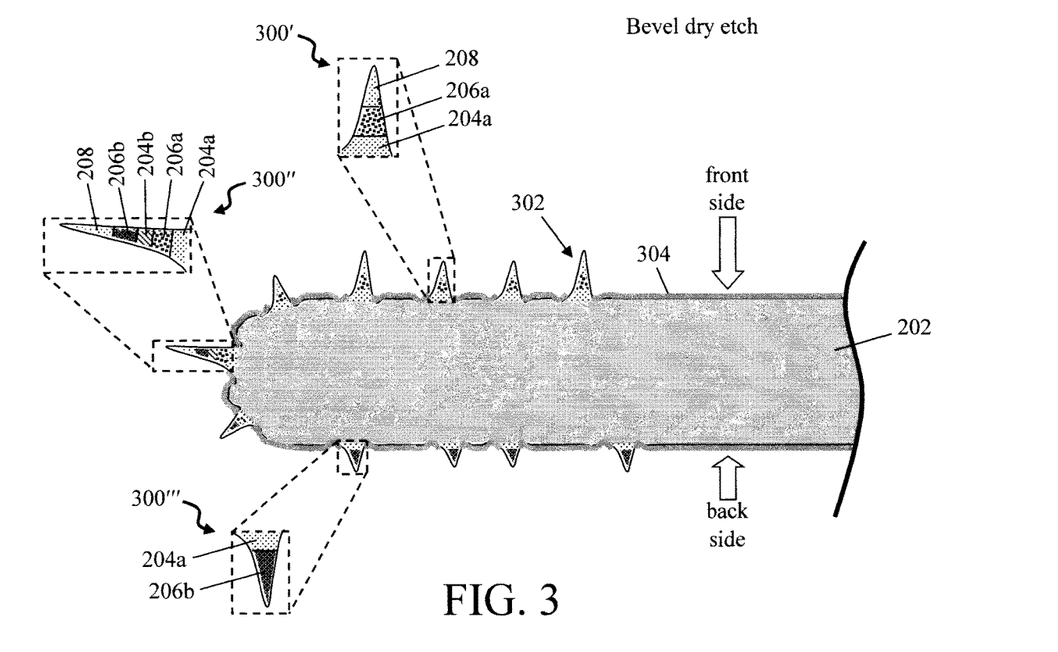
FIG. 3 is a cross-sectional diagram illustrating a bevel dry etch having been performed to break up the layers of contaminants with embedded metals, which forms a damaged layer on surfaces of the wafer according to an embodiment of the present invention.

As shown in FIG. 3, and as described in conjunction with the description of step 102 of methodology 100 above, the first contaminant removal step in the cleaning process is a bevel dry etch. According to an exemplary embodiment, this bevel dry etch is performed only on the bevel of wafer 202, while the remainder of wafer 202 is protected by a plasma exclusion zone (using, e.g., a plasma exclusion zone ring). As highlighted above, this bevel dry etch is performed using specific etch chemistries for breaking up the continuous layers of dielectric 204a,b, etc., 208, etc. and embedded metal 206a,b, etc. contaminants at the bevel of wafer 202. For instance, suitable etch chemistries for dielectric materials such as SiOx and/or SiN include, but are not limited to, F-containing plasmas such as a $CF_4$-containing plasma, a $SF_6$-containing plasma and/or a $NF_3$-containing plasma. Suitable etch chemistries for metals such as Al, Cu, Fe, Ru, Ta, Ti, Cr, and/or Co include, but are not limited to, Cl-containing plasmas such as a $Cl_2$-containing plasma and/or a $BCL_3$-containing plasma. By way of example only, in one non-limiting embodiment, this bevel dry etch is performed in multiple cycles employing alternating etch chemistries (see above) for removing specific materials/elements, i.e., layer by layer.

As shown in FIG. 3, this bevel dry etch breaks up the continuous layers of dielectric 204a,b, etc., 208, etc. and embedded metal 206a,b, etc. contaminants at the bevel of wafer 202, but leaves behind structures 302 such as pillars, whiskers, grass structures, micromasking, etc. on the surfaces of wafer 202. These structures 302 are the result of the extensive etch needed to break up the contaminant layers, as well as the high selectivity difference between the wafer material (e.g., Si, SiGe, etc.) and the metals 206a,b, etc. As described above, if these structures remain on the front/device side of wafer 202 this can undesirably lead to particle issues which can result in a loss in device yield. As shown in magnified views 300', 300" and 300''', the structures 302 include portions of the dielectric 204a,b, etc., 208, etc. and/or embedded metal 206a,b, etc. contaminants. As will be described in detail below, these remaining contaminants will be removed from the surface of wafer 202 using a lift-off process.

As shown in FIG. 3, the dry bevel etch also leaves behind a damaged layer 304 on the surface of wafer 202 that needs to be removed. Although not explicitly shown in the figures, the exposure of the wafer to the ambient environment can also result in the formation of a native oxide on the front and back side surface of wafer 202 which also needs to be removed. Thus, following the dry bevel etch, a sequence of wet etch steps are performed, in a specific order, to remove the damaged layer 304 and surface oxide and any remaining contaminants (see, e.g., raised structures 302). Generally, the goal is to have the bevel of wafer 202 be substantially free of contaminants such as the dielectric and embedded metal contaminants described above. For instance, according to an exemplary embodiment, following the present cleaning process the bevel has a contamination level of less than or equal to about at most $5 \times 10^{10}$ at/cm$^2$. The present process will also serve to remove any surface roughness including any remaining structures 302.

Figure 4:
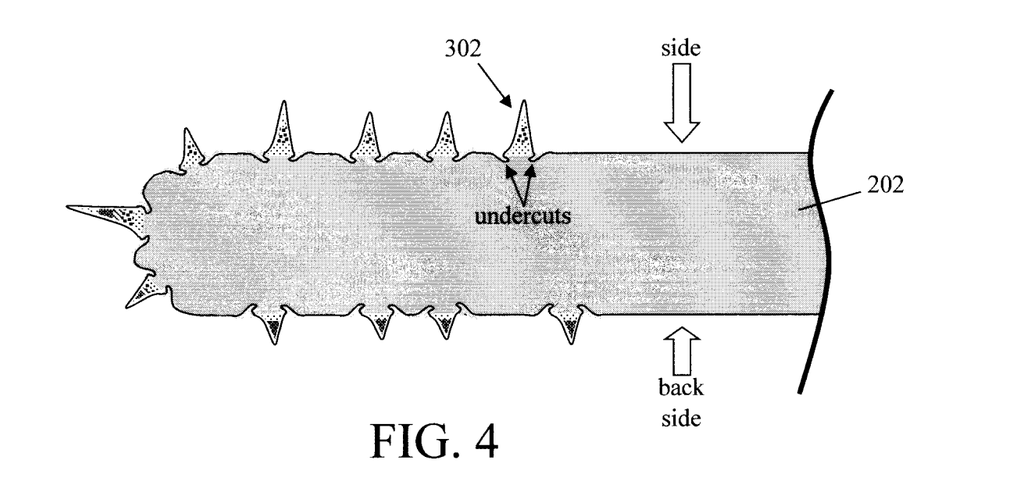
FIG. 4 is a cross-sectional diagram illustrating a first wet etch having been performed to remove the damaged layer which undercuts the surfaces of the wafer beneath any remaining contaminants according to an embodiment of the present invention.

As shown in FIG. 4, and as described in conjunction with the description of step 106 of methodology 100 above, the first wet etch step in the sequence removes the surface oxide and damaged layer from the surface of wafer 202 following the dry bevel etch. As provided above, suitable etchants for removing surface oxide and damage from the surface of a semiconductor wafer include, but are not limited to, HF or a $H_2O_2$:$NH_4OH$ mixture. For instance, a mixture of $H_2O_2$:$NH_4OH$ is effective in removing the particles and residue that make up the damaged layer following the bevel dry etch, while HF is effective in removing surface native oxides. According to an exemplary embodiment, an aqueous solution of $H_2O_2$:$NH_4OH$ is employed. The HF can be diluted in $H_2O$ (i.e., a DHF solution) at a ratio HF:$H_2O$ of from about 1:50 to about 1:100 and ranges therebetween.

As provided above, separate treatments of the front and back sides of the wafer 202 are preferably performed in a particular sequence to reduce the effects of splash back during the cleaning process. For instance, in one exemplary embodiment, a first wet etch is performed on the back side of wafer 202 to remove the surface oxide and damaged layer from the back side of wafer 202, followed by a second wet etch performed on the front side of wafer 202 to remove the surface oxide and damaged layer from the front side of wafer 202. That way, any contaminants redeposited on the front side of wafer 202 during the back side clean can be effectively removed by the second wet etch step.

As shown in FIG. 4, this first wet etch step can create undercuts in the wafer 202 beneath the structures 302. Namely, due to its isotropic nature, this wet etch to remove the surface oxide and damaged layer slightly undercuts a surface of the wafer 202 beneath the contaminants that remain following the bevel dry etch. This undercutting will be leveraged to facilitate removal of these remaining contaminants from the surface of the wafer 202 using a lift-off process as described below.

Figure 5:
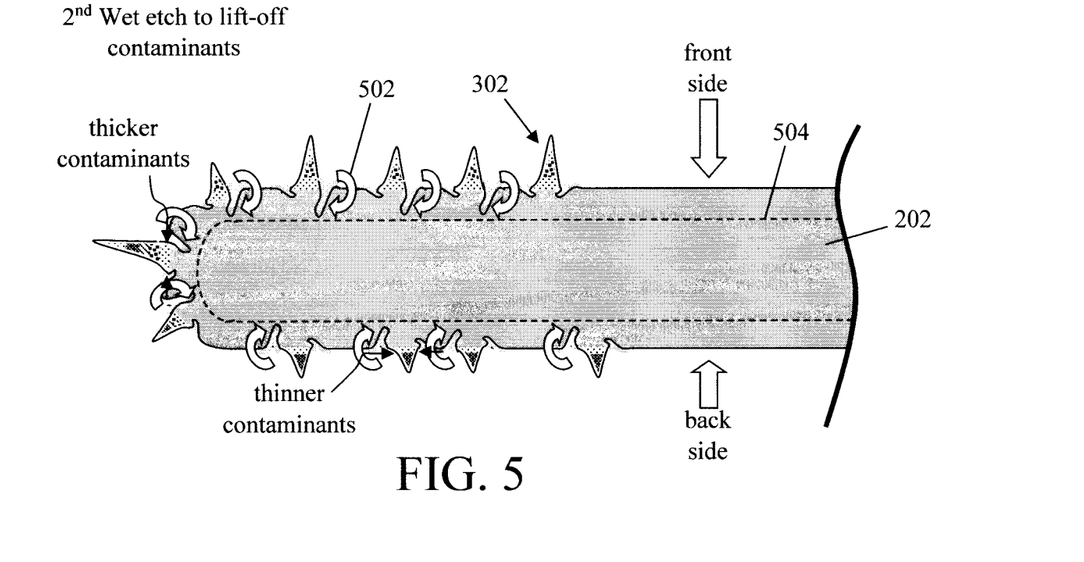
FIG. 5 is a cross-sectional diagram illustrating a second wet etch having been performed to lift-off the remaining contaminants according to an embodiment of the present invention.

As shown in FIG. 5, and as described in conjunction with the description of step 106 of methodology 100 above, the second wet etch step in the sequence is applied to the front and back sides of wafer 202 to etch the surface of wafer 202 and lift-off the remaining contaminants. As provided above, suitable etchants for this second wet etch step include, but are not limited to, quaternary ammonium hydroxide solutions such as TMAH and/or TEAH which are highly selective for etching the surface of wafer 202. According to an exemplary embodiment, an aqueous solution containing from about 3 wt % to about 30 wt % TMAH or TEAH is employed.

As described above, the surface of the wafer 202 has already been slightly undercut beneath the structures 302 with the embedded metal contaminants. As indicated by arrows 502 in FIG. 5, this undercutting now provides a pathway for the etchant (e.g., TMAH/TEAH) to access the wafer surface, permitting a controlled etch of the wafer surface along with any embedded defects. Dotted lines 504 are used to indicate the depth of the etch into the underlying wafer 202. This second wet etch step also removes any roughness and/or Si-rich residue, needles, pitted Si and/or dry etch residues.

As provided above, application of this second wet etch treatment can be varied for the front side and back side of wafer 202. For instance, according to an exemplary embodiment, the back side of the wafer receives multiple (e.g., two) treatments with the quaternary ammonium hydroxide solution, while the front side of the wafer receives fewer or even a single treatment. Further, as highlighted above, the back side treatment is preferably performed using an edge dispense wherein the quaternary ammonium hydroxide solution is dispensed close to the edge of wafer 202 creating a wrap-around at the bevel with slower flow rate at the edge as well. Doing so helps with lift-off of the thicker contaminants at the edge of the wafer 202. By comparison, the contaminants on the back side of the wafer 202 are thinner. See FIG. 5.

Figure 6:
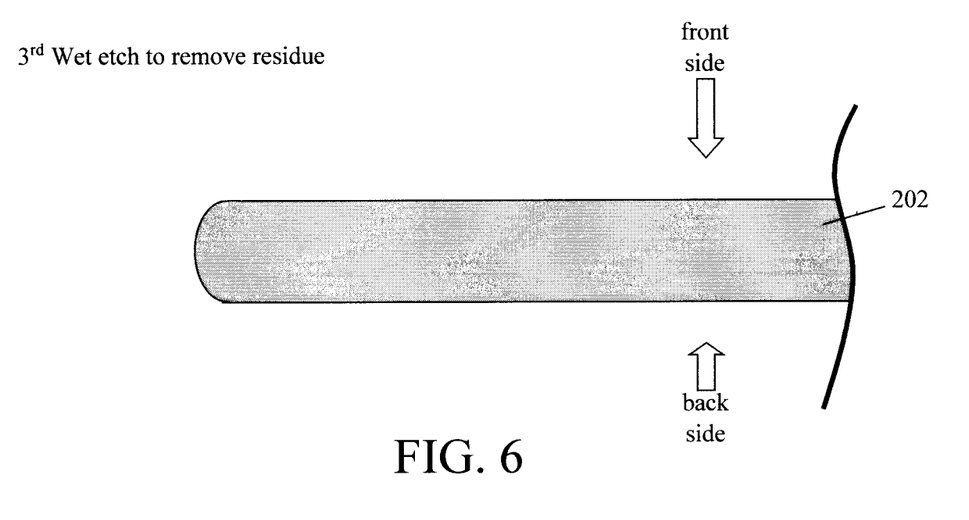
FIG. 6 is a cross-sectional diagram illustrating a third wet etch having been performed to remove residue and surface roughness from the surfaces of the wafer, to render the bevel of the wafer substantially free of contaminants according to an embodiment of the present invention.

As shown in FIG. 6, and as described in conjunction with the description of step 108 of methodology 100 above, the third wet etch step in the sequence is applied to the front side of the wafer 202 to remove any remaining residue redeposited from the back side clean due, for example, to splash back. See above. Suitable etchants for this third wet etch step include, but are not limited to, HF. For instance, the HF can be diluted in $H_2O$ (i.e., a DHF solution) at a ratio HF:$H_2O$ of from about 1:50 to about 1:100 and ranges therebetween.

Following this third wet etch step, the bevel of wafer 202 is substantially free of contaminants including embedded metals. As provided above, this means that the bevel of wafer 202 has a contamination level of less than or equal to about $5 \times 10^{10}$ at/cm$^2$. Further, this third wet etch step serves to remove any surface roughness. Thus, the bevel of wafer 202 has a smooth surface free of metal contamination. By way of example only, surface roughness of a semiconductor wafer can be ascertained using optical analysis techniques such as electron microscopy and/or optical inspection. For instance, a smooth wafer surface will be free of any raised structures such as pillars, whiskers, grass structures and/or micromasking.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of processing a wafer, the method comprising:

breaking up contaminants that include layers of embedded metals and dielectrics formed on a bevel of the wafer using a bevel dry etch, wherein the dry bevel etch leaves behind structures comprising the remaining portions of the contaminants on the surfaces of the wafer, and wherein at least one of the structures is present on the edge of the wafer and includes portions of a first dielectric layer, a first metal layer, a second dielectric layer, a second metal layer, and a third dielectric layer, and wherein the first metal layer and the second metal layer each comprise a metal selected from the group consisting of: aluminum, copper, iron, ruthenium, tantalum, titanium, chromium, cobalt and combinations thereof, and wherein the first dielectric layer, the second dielectric layer, and the third dielectric layer each comprises a material selected from the group consisting of: silicon oxide, silicon nitride, and combinations thereof, and wherein the bevel dry etch is performed in multiple cycles alternating between a F-containing plasma for etching the first dielectric layer, the second dielectric layer, and the third dielectric layer and a Cl-containing plasma for etching the first metal layer and the second metal layer, in a layer by layer manner;

creating pathways in the wafer undercutting any remaining portions of the contaminants using a first wet etch, the first wet etch further removing a damaged layer resulting from the bevel dry etch;

lifting off the undercut remaining portions of the contaminants using a second wet etch that follows the pathways in the wafer made by the undercutting; and removing residue and surface roughness from the wafer using a third wet etch.

2. The method of claim 1, wherein the bevel comprises a portion of the wafer that is less than or equal to about 3 millimeters in from the edge of the wafer.

3. The method of claim 1, wherein the contaminants comprise at least one continuous layer that wraps wrap around the bevel from a front side of the wafer to the back side of the wafer.

4. The method of claim 1, wherein the bevel dry etch is performed using a fluorine (F)-containing plasma and a chlorine (Cl)-containing plasma.

5. The method of claim 4, wherein the F-containing plasma is selected from the group consisting of: a tetrafluoromethane ($CF_4$)-containing plasma, a sulfur hexafluoride ($SF_6$)-containing plasma, a nitrogen trifluoride ($NF_3$)-containing plasma, and combinations thereof.

6. The method of claim 4, wherein the Cl-containing plasma is selected from the group consisting of: a dichlorine ($Cl_2$)-containing plasma, a boron trichloride ($BCL_3$)-containing plasma, and combinations thereof.

7. The method of claim 1, wherein the bevel dry etch is performed on the bevel while a remainder of the wafer is protected using a plasma exclusion zone.

8. The method of claim 1, wherein the structures are selected from the group consisting of: pillars, whiskers, grass structures, and micromasking.

9. The method of claim 1, wherein the first wet etch is performed using an etchant selected from the group consisting of: hydrofluoric acid (HF), and a hydrogen peroxide ($H_2O_2$):ammonium hydroxide ($NH_4OH$) mixture.

10. The method of claim 1, wherein the first wet etch is performed on the back side of the wafer before the first wet etch is performed on a front side of the wafer.

11. The method of claim 1, wherein the second wet etch is performed using an etchant comprising a quaternary ammonium hydroxide solution.

12. The method of claim 11, wherein the quaternary ammonium hydroxide solution is selected from the group consisting of: tetramethylammonium hydroxide (TMAH), tetraethylammonium hydroxide (TEAH), and combinations thereof.

13. The method of claim 11, wherein performing the second wet etch comprises varying the etchant comprising the quaternary ammonium hydroxide solution applied to a front side and the back side of the wafer.

14. The method of claim 1, wherein the third wet etch is performed using an etchant comprising hydrofluoric acid (HF).

15. The method of claim 1, wherein, following the bevel dry etch and the sequence of wet etches, the bevel of the wafer has a final contamination level of less than or equal to about $5 \times 10^{10}$ at/cm$^2$.

16. The method of claim 1, wherein the first dielectric layer directly contacts the second metal layer on the back side of the wafer, and wherein the first metal layer directly contacts the third dielectric layer on a front side of the wafer.

* * * * *